United States Patent
Yamazaki et al.

[11] Patent Number: 6,153,445
[45] Date of Patent: Nov. 28, 2000

[54] METHOD OF MANUFACTURING SEMICONDUCTOR DEVICE

[75] Inventors: Shunpei Yamazaki, Tokyo; Hisashi Ohtani, Kanagawa, both of Japan

[73] Assignee: Semiconductor Energy Laboratory Co., Ltd., Kanagawa-Ken, Japan

[21] Appl. No.: 09/025,582

[22] Filed: Feb. 18, 1998

[30] Foreign Application Priority Data

Feb. 19, 1997  [JP]  Japan ..................................... 9-051087

[51] Int. Cl.⁷ .................................................. H01L 21/00
[52] U.S. Cl. .......................... 438/30; 438/158; 438/160; 438/166
[58] Field of Search .............................. 438/30, 158, 160, 438/166

[56] References Cited

U.S. PATENT DOCUMENTS

| | | | |
|---|---|---|---|
| 5,362,684 | 11/1994 | Saito et al. ................................ | 437/224 |
| 5,417,770 | 5/1995 | Siatoh et al. .............................. | 136/258 |
| 5,510,631 | 4/1996 | Siato et al. ................................. | 257/77 |
| 5,529,937 | 6/1996 | Zhang et al. . | |
| 5,591,492 | 1/1997 | Hirai et al. ............................... | 427/563 |
| 5,608,232 | 3/1997 | Yamazaki et al. . | |
| 5,639,698 | 6/1997 | Yamazaki et al. . | |
| 5,700,333 | 12/1997 | Yamazaki et al. . | |
| 5,773,327 | 6/1998 | Yamazaki et al. . | |
| 5,789,284 | 8/1998 | Yamazaki et al. . | |
| 5,814,540 | 9/1998 | Takemura et al. . | |
| 5,869,363 | 2/1999 | Yamazaki et al. . | |
| 5,888,858 | 3/1999 | Yamazaki et al. . | |
| 5,893,730 | 4/1999 | Yamazaki et al. . | |
| 5,897,347 | 4/1999 | Yamazaki et al. . | |
| 5,913,112 | 6/1999 | Yamazaki et al. ...................... | 438/165 |
| 5,915,174 | 6/1999 | Yamazaki et al. . | |
| 5,949,115 | 9/1999 | Yamazaki et al. . | |
| 5,956,579 | 9/1999 | Yamazaki et al. . | |
| 5,961,743 | 10/1999 | Yamazaki et al. . | |
| 5,977,559 | 11/1999 | Zhang et al. . | |
| 5,985,740 | 11/1999 | Yamazaki et al. . | |

*Primary Examiner*—Amir Zarabian
*Assistant Examiner*—Michael S. Lebentritt
*Attorney, Agent, or Firm*—Fish & Richardson PC

[57] ABSTRACT

A catalyst element for accelerating crystallization is added to an amorphous silicon film containing an impurity element for threshold voltage control, and a heat treatment is then performed to obtain a crystalline silicon film. Thereafter, the catalyst element is gettered by performing a heat treatment in an atmosphere containing a halogen element. In this step, a chemical equilibrium state is established for the impurity element for threshold voltage control by mixing a compound gas containing the impurity element into the atmosphere, thereby preventing the impurity element from escaping into the vapor phase.

24 Claims, 7 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device that uses a thin-film semiconductor having crystallinity. In particular, the invention relates to manufacture of an insulated-gate thin-film transistor (TFT).

2. Description of the Related Art

In recent years, the techniques of forming a TFT using a crystalline silicon film (particularly a film made of a material called polysilicon film) on a substrate having an insulative surface have been developed. A TFT using such a material is advantageous over a TFT using an amorphous silicon film in being capable of high-speed operation.

For this reason, extensive studies are now being made on the monolithic panel in which a pixel matrix circuit and driver circuits are formed on the same substrate as well as the system-on-panel structure in which signal processing logic circuits (memories, amplifiers, a CPU, etc.) are additionally formed in an integral manner. For example, the driver circuits and the logic circuits are formed as a composite circuit in which a CMOS circuit (inverter circuit) that is a complementary combination of an n-type TFT and a p-type TFT is used as a basic circuit.

The TFT that constitutes such a variety of circuits is a switching element that is turned on when a particular voltage (called a threshold value or a threshold voltage) is applied to the gate electrode and that is rendered off when a voltage lower than the particular voltage is applied. Therefore, precise control of the threshold voltage is very important for correct operation of a circuit.

However, there may occur an event that the threshold voltage of a TFT shifts to the positive or negative side due to indefinite factors in a manufacturing process, such as influences of mobile ions that have been introduced by pollution and a difference in work function or interface charge in the vicinity of the gate of the TFT.

Such a shift of the threshold voltage causes adverse effects such as impairing the switching element function and increasing the power consumption. Although the pollution-induced factors can be removed by, for instance, improving the process, the factors caused by a work function difference or the like are determined by the materials used and hence are difficult to remove in some cases.

The channel doping has been proposed to remove the latter factors. The channel doping is a technique of controlling, i.e., intentionally shifting the threshold voltage by adding an impurity element (typically, P, As, or B) that imparts one conductivity type to at least the channel forming region of a TFT. To control the threshold voltage to a desired value, it is necessary to control the addition amount of the impurity element very precisely.

The impurity element may be added by mixing it into a gas for forming an amorphous silicon film or a crystalline silicon film or by performing ion implantation or the like after crystallization. Further, the impurity element may be added selectively, i.e., only to a portion, to become a channel forming region, of a crystalline silicon film that has been shaped into an island-like pattern.

After concentrated studies for obtaining superior TFT characteristics, the present inventors invented a crystalline silicon film having much superior crystallinity. Conditions necessary for forming this crystalline silicon film will be described below briefly.

First, an amorphous silicon film is formed on a highly heat resistant substrate (for instance, a quartz substrate) and then crystallized by utilizing the technique disclosed by the present inventors in Japanese Unexamined Patent Publication No. 7-130652, which is a technique of adding a catalyst element (typically nickel) for accelerating crystallization to an amorphous silicon film and then crystallizing it by a heat treatment. The disclosure thereof is incorporated herein by reference.

After a crystalline silicon film has been obtained, the catalyst element is gettered by performing a heat treatment in an atmosphere containing a halogen element. This gettering step utilizes the metal element gettering effect of the halogen element. To obtain a sufficient gettering effect of the halogen element, it is preferable that the heat treatment be performed at more than 700° C.

In the gettering step, the catalyst element remaining in the crystalline silicon film is combined with, i.e., gettered by, the halogen element to become a volatile halide which escapes into the air. The catalyst element is thus removed. As a result of the catalyst element gettering step, the concentration of the catalyst element in the crystalline silicon film is reduced to less than $1 \times 10^{17}$ atoms/cm$^3$ (preferably less than the spin density). In this specification, the impurity concentration is defined as the minimum value of measurement values obtained by secondary ion mass spectroscopy analysis.

A crystalline silicon film that is formed in the above-described manner has a feature that it is a crystal structural body as a collection of a plurality of rod-like or flat-rod-like crystals and microscopically the growth directions of the respective rod-like crystals are aligned in a particular direction. Further, the crystallinity inside the crystals has been greatly improved by the heat treatment of the gettering step.

However, in experimentally producing various kinds of TFTs by using crystalline silicon films of the above kind, the present inventors have found that a serious problem occurs in applying the above-mentioned channel doping. This is an phenomenon that in removing a catalyst element in the gettering step, an impurity element (B, P, As, or the like) that has been added to the surface layer and its vicinity of the crystalline silicon film is exhausted. This phenomenon is reported in IBM Technical Disclosure Bulletin, Vol. 1, No. 5, 1973. The disclosure thereof is incorporated herein by reference.

Since the concentration of the impurity element in the region (in the vicinity of the surface of the active layer) where a channel is to be formed is much reduced, the intended effect of the channel doping is not obtained, which makes it impossible to control the threshold voltage precisely.

SUMMARY OF THE INVENTION

The above problem was first recognized when the conventional channel doping was applied to the above-described method of forming a crystalline silicon film; no one recognized the problem before that. An object of the present invention is therefore to solve the above entirely new problem that no one has recognized.

Specifically, an object of the invention is to provide a technique for performing a heat treatment in an atmosphere containing a halogen element without exhausting an impurity element such as phosphorus or boron existing in the vicinity of the surface of a crystalline silicon film.

According to one aspect of the present invention, there is provided a method of manufacturing a semiconductor device, comprising the steps of forming an amorphous silicon film containing a group-13 or group-15 impurity element; converting the amorphous silicon film into a crystalline silicon film by performing a heat treatment; and performing a heat treatment in an atmosphere containing a halogen element and a compound gas that contains the impurity element.

According to another aspect of the present invention, there is provided a method of manufacturing a semiconductor device, comprising the steps of holding, adjacent to an amorphous silicon film containing a group-13 or group-15 impurity element, a catalyst element for accelerating crystallization of the amorphous silicon film; converting at least part of the amorphous silicon film into a crystalline silicon film by performing a heat treatment; and removing or reducing a concentration of the catalyst element from the crystalline silicon film by performing a heat treatment in an atmosphere containing a halogen element and a compound gas that contains the impurity element.

According to a further aspect of the present invention, there is provided a method of manufacturing a semiconductor device, comprising the steps of adding a group-13 or group-15 impurity element to an amorphous silicon film; holding a catalyst element for accelerating crystallization of the amorphous silicon film adjacent to the amorphous silicon film; converting at least part of the amorphous silicon film into a crystalline silicon film by performing a heat treatment; and removing or reducing a concentration of the catalyst element from the crystalline silicon film by performing a heat treatment in an atmosphere containing a halogen element and a compound gas that contains the impurity element.

In the invention, in gettering a catalyst element in an atmosphere containing a halogen element, a compound gas containing a group-13 or group-15 impurity element (for threshold voltage control) is mixed into the processing atmosphere. (Preferably, a compound gas of the halogen element and the impurity element is mixed.)

As a result, a chemical equilibrium state for the impurity element is established between the processing atmosphere and the surface to be processed. With this measure, the chemical reaction involving the impurity element near the surface of the silicon film can be suppressed, whereby the impurity element for threshold voltage control can effectively be prevented from being removed from the silicon film.

Typical examples of the impurity element for threshold voltage control (channel doping) are a group-13 element of boron (B) and group-15 elements of phosphorus (P) and arsenic (As). Group-13 elements of aluminum (Al) and gallium (Ga) and a group-15 element of antimony (Sb), etc. may also be used. The selection among those elements is made in accordance with the conductivity type of an intended TFT and the threshold voltage shifting direction (positive or negative side).

Examples of the compound gas containing the impurity element for threshold voltage control are diborane ($B_2H_6$), boron trifluoride ($BF_3$), boron trichloride ($BCl_3$), aluminum trichloride ($AlCl_3$), and gallium trichloride ($GaCl_3$) each of which include a group-13 element, and phosphine ($PH_3$), phosphorus trichloride ($PF_3$), phosphorus trichloride ($PCl_3$), arsine ($AsH_3$), arsenic trifluoride ($AsF_3$), arsenic trifluoride ($AsCl_3$), stibine ($SbH_3$), and antimony trichloride ($SbCl_3$) each of which include a group-15 element.

DETAILED DESCRIPTION OF THE PREFERRED EMBODIMENTS

According to the invention, first an amorphous silicon film containing a group-13 or group-15 impurity element for threshold voltage control is formed on a substrate having an insulative surface. A crystalline silicon film is obtained by performing a heat treatment in a state that a catalyst element for accelerating crystallization is held adjacent to the amorphous silicon film.

Next, the catalyst element remaining in the crystalline silicon film is removed or reduced in concentration by performing a heat treatment in an atmosphere containing a halogen element. In this step, a compound gas containing the impurity element that has been added to the amorphous silicon film is introduced in the processing atmosphere. Since a chemical equilibrium state for the impurity element is established between the processing atmosphere and the surface to be processed (crystalline silicon film), the impurity element can effectively be prevented from escaping from the crystalline silicon film.

As a result, the heat treatment in the atmosphere containing the halogen element can be performed without impairing the effect of the channel doping.

EMBODIMENT 1

In this embodiment, an exemplary manufacturing process for manufacturing an active matrix substrate in which CMOS circuits and a pixel matrix circuit are formed on the same substrate will be described with reference to FIGS. 1A–1D to 3A–3E. This embodiment is just an example and the present invention is not limited to such a manufacturing process.

Figure 1A:
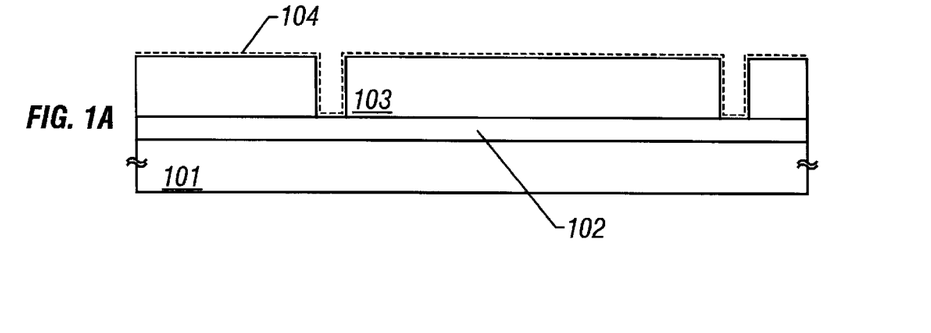
FIGS. 1A–1D, FIGS. 2A–2E, and FIGS. 3A–3E show a manufacturing process of an active matrix substrate according to a first embodiment of the present invention.
Figure 1B:
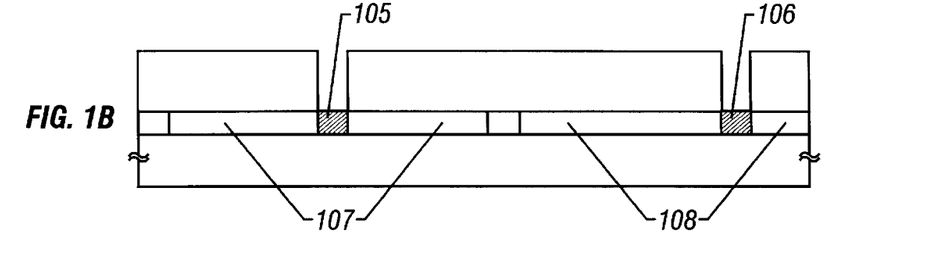

In FIG. 1A, reference numeral 101 denotes a quartz substrate. Alternatively, a silicon substrate or a ceramic substrate formed with an insulating film of 0.5–5 $\mu$m in thickness on its surface may be used. It is effective to use, for purposes that do not require a transparent substrate as in the case of reflection-type display devices, an inexpensive, low-grade silicon substrate as used in the solar battery.

The thickness of an amorphous silicon film 102 is adjusted so that its final thickness (reduced by thermal oxidation) will be 10–75 nm (preferably 15–45 nm). The amorphous silicon film 102 may be formed by low pressure CVD or plasma CVD.

In the above step, in this embodiment diborane ($B_2H_6$) is introduced in the film forming gas so that a proper amount of boron is contained in the amorphous silicon film 102. The purpose of adding boron is to shift by about 1 V to the positive side (phosphorus, arsenic, or the like may be used to shift the threshold voltage to the negative side). The content needs to be determined in advance by experiments; in this embodiment, adjustments are made to set it at 2 ppm.

Next, the amorphous silicon film 102 is crystallized. In this embodiment, this is done in the following manner by utilizing the technique disclosed in Japanese Unexamined Patent Publication No. 8-78329. The disclosure thereof is incorporated herein by reference. First, a thin oxide film (not shown) is formed on the surface of the amorphous silicon film 102. Then, there is formed a mask insulating film 103 for enabling selection of regions where a catalyst element (nickel is used in this embodiment) is to be added.

After the formation of the mask insulating film 103, a nickel-containing layer 104 is formed by applying, by spin coating, a solution containing nickel (Ni) as a catalyst element for accelerating crystallization of the amorphous silicon film 102 (see FIG. 1A). Other examples of the catalyst element are the following elements capable of accelerating crystallization of silicon: cobalt (Co), iron (Fe), tin (Sn), lead (Pb), palladium (Pd), platinum (Pt), copper (Cu), and gold (Au).

After completion of the nickel adding step, the amorphous silicon film 102 is crystallized by performing a heat treatment at 500°–700° C. (typically 550°–650° C.) for 4–8 hours in an inactive atmosphere, an $O_2$ atmosphere, or an $H_2$ atmosphere. In this step, crystallization of the amorphous silicon film 102 proceeds with priority at nickel-added regions 105 and 106 and lateral growth regions 107 and 108 are formed by growth that is approximately parallel with the substrate 101 (see FIG. 1B).

After the completion of the heat treatment for crystallization, the mask insulating film 103 is removed. Then, a (first) nickel gettering step is executed by performing a heat treatment at more than 700° C. (preferably 800°–1,000° C., typically 950° C.) for 0.1–6 hours (typically 0.5–1 hour) in an atmosphere containing a halogen element (see FIG. 1C). In the present invention, in this step a compound gas containing an impurity element for threshold voltage control (in this embodiment, boron) is introduced into the atmosphere.

Figure 1C:
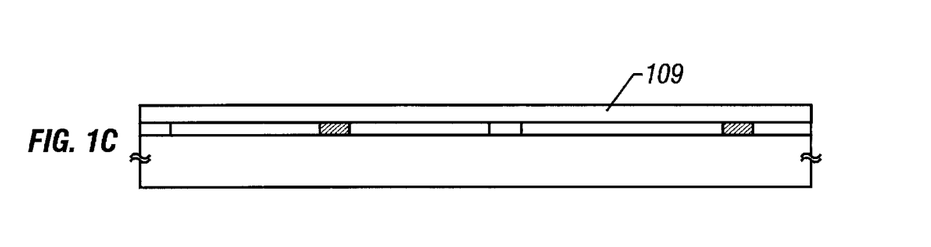

In this embodiment, the above heat treatment is performed in an atmosphere in which hydrogen chloride (HCl) and boron trichloride ($BCl_3$) are added at 0.5–10 volume percent and 0.1–10 volume percent, respectively, with respect to an oxygen atmosphere. In this case, to prevent boron from escaping from the silicon film, it is important to keep a chemical equilibrium state for boron between the processing atmosphere and the surface to be processed.

Although in this embodiment an HCl gas is used as a compound gas containing a halogen element, a gas of one or a plurality of the following typical halogen-inclusive compounds may also be used: HF, $NF_3$, HBr, $Cl_2$, $ClF_3$, $BCl_3$, $BF_3$, $F_2$, and $Br_2$.

In the present invention, the compound gas containing the impurity element for threshold voltage control is not limited to $BCl_3$, and $B_2H_6$, $BF_3$, and the like may also be used. $PH_3$, $PF_3$, or $PCl_3$ may be employed when phosphorus is used for the threshold voltage control, and $AsH_3$, $AsF_3$, or $AsCl_3$ may be employed when arsenic is used for the threshold voltage control.

In the above step, nickel that remains in the crystalline silicon film (the amorphous components that remained after the crystallization step are completely crystallized by the above heat treatment) is gettered by the action of chlorine and escapes into the air in the form of volatile nickel chloride.

In the gettering step of FIG. 1C, thermal oxidation reaction proceeds at the surface of the silicon film, whereby an oxide film 109 is formed that is increased in thickness on the silicon film. However, the oxide film 109 does not serve as a blocking layer that prevents nickel chloride from escaping. The oxide film 109 has a function of preventing silicon atoms from escaping in the form of such a compound as dichlorosilane ($SiH_2Cl_2$).

As a result of the catalyst element gettering step, the nickel concentration of the lateral growth regions 107 and 108 is reduced to less than $1\times10^{17}$ atoms/cm$^3$ (preferably less than the spin density). A similar secondary ion mass spectroscopy analysis showed that the halogen element used for the gettering remain in the lateral growth regions 107 and 108 at a concentration of $1\times10^{15}$ to $1\times10^{20}$ atoms/cm$^3$.

It appears that during the gettering step boron that is intentionally added for the threshold voltage control escapes in the form of boron trichloride. However, by virtue of the chemical equilibrium state for boron trichloride between the processing atmosphere and the surface to be processed, the escape of boron from the silicon film can be suppressed effectively.

Figure 1D:
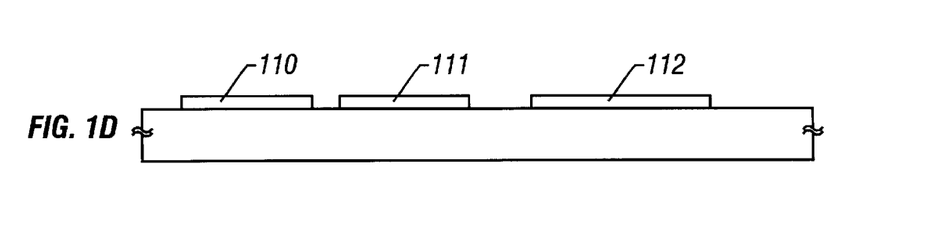

Next, after the oxide film 109 is removed, patterning is performed to form island-like semiconductor layers (active layers) 110–112 that are entirely lateral growth regions (see FIG. 1D). A silicon oxide film 113 to become gate insulating films later is formed thereon. The thickness of the silicon oxide film 113 may be adjusted so that a necessary thickness is finally obtained as a result of an increase corresponding to the thickness of a thermal oxidation film that will be formed in a later thermal oxidation step.

Figure 2A:
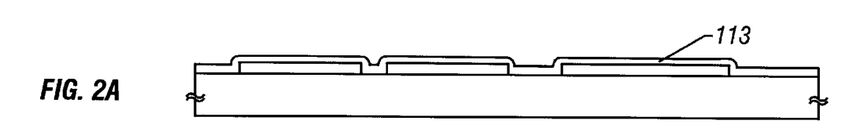

Next, a (second) catalyst element gettering step is executed as shown in FIG. 2A under the same conditions as the first gettering step. In this step, thermal oxidation reaction proceeds at the interfaces between the active layers 110–112 and the silicon oxide film 113 and the total thickness of the silicon oxide film 113 increases by the thickness of a thermal oxidation film (not shown) formed by this step.

After the heat treatment in the halogen atmosphere, a heat treatment is performed at 950° C. for about one hour in a nitrogen atmosphere, whereby the film quality of the silicon oxide film 113 is improved and much superior semiconductor/insulating film interfaces are obtained.

Each crystalline silicon film obtained by the above steps is a crystal structural body in which a plurality of rod-like or flat-rod-like crystals have grown with directivity, i.e., approximately parallel with each other. Each rod-like crystal is bounded by grain boundaries extending approximately parallel with each other.

After the active layers 110–112 of such crystal structural bodies have been obtained, an aluminum film (not shown) containing scandium at 0.2 wt % is formed and then shaped into electrode patterns as starting members of gate electrodes. Instead of an aluminum film, a film of tantalum, tungsten, molybdenum, silicon, or the like may be used. Gate electrodes 114–116 and anodic oxide films 117–119 are formed by anodizing the surfaces of those patterns (see FIG. 2B).

Figure 2B:
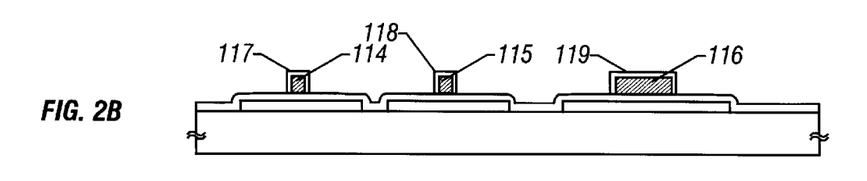

Thereafter, the silicon oxide film 113 is etched in a self-aligned manner by using the gate electrodes 114–116 as a mask. This may be done by dry etching by using a $CHF_3$ gas. As a result of this step, gate insulating films 120–122 are formed so as to remain only right under the gate electrodes.

Then, after a resist mask 123 is formed so as to cover a region to become a p-channel TFT, impurity ions for imparting n-type conductivity are added. This may be done by ion implantation or plasma doping. Since the concentration (represented by n−) obtained in this step is equal to the concentration (about $1\times10^{18}$ to $1\times10^{19}$ atoms/cm$^3$) of LDD regions that will be formed later, it needs to be controlled precisely by determining an optimum value experimentally in advance. N− regions 124–127 are thus formed (see FIG. 2C).

Figure 2C:
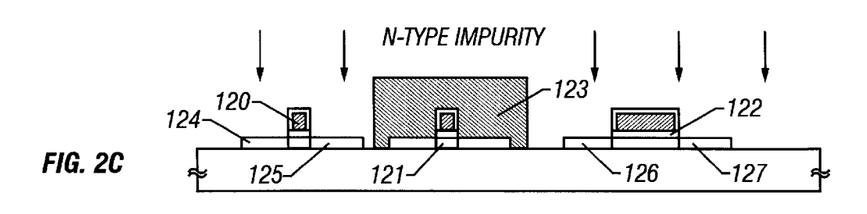

After the formation of the n− regions 124–127, the resist mask 123 is removed and a resist mask 128 is formed so as to cover regions to become n-channel TFTs this time.

Figure 2D:
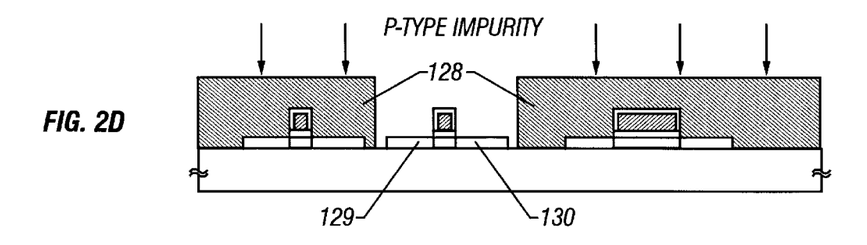
Figure 2E:
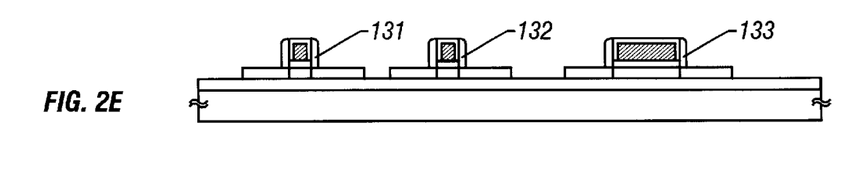

Impurity ions for imparting p-type conductivity are then added to form p⁻ regions 129 and 130 (see FIG. 2D). Since the concentration of the p⁻ regions 129 and 130 is equal to the concentration (about $5\times10^{18}$ to $5\times10^{19}$ atoms/cm$^3$) of an LDD region that will be formed later, it needs to be controlled precisely.

After the n⁻ regions 124–127 and the p⁻ regions 129 and 130 have been formed in the above manner, the resist mask 128 is removed. Thereafter, a silicon oxide film (not shown) of 0.5–2 μm is formed and then shaped into sidewalls 131–133 (see FIG. 2E) by etch back.

Figure 3A:
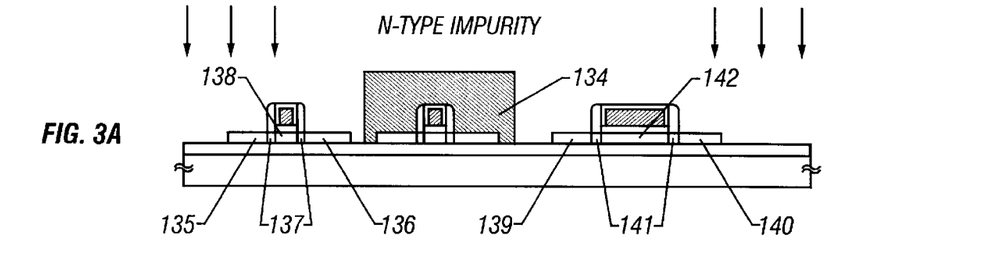

Next, after the region of the p-channel TFT is again covered with a resist mask 134, impurity ions for imparting n-type conductivity are added so as to provide a higher concentration (represented by n⁺) than the concentration (n⁻) of the previous addition. This concentration is adjusted so that the sheet resistance of the source and drain regions become less than 500 Ω (preferably less than 300 Ω).

As a result of this step, a source region 135, a drain region 136, and low-concentration impurity regions (in particular, one on the drain region side is called an LDD region) 137 of the n-channel TFT are formed. A channel forming region 138 is formed right under the gate electrode. At the same time, a source region 139, a drain region 140, low-concentration impurity regions 141, and a channel forming region 142 of the n-channel pixel TFT that constitutes the pixel matrix circuit are formed (see FIG. 3A).

Next, after the resist mask 134 is removed, a resist mask 143 is formed so as to cover the region of the n-channel TFT. A source region 144, a drain region 145, low-concentration impurity regions 146, and a channel forming region 147 of the p-channel TFT that constitutes the CMOS circuit are formed by adding impurity ions for imparting p-type conductivity at a higher concentration (represented by p⁺) than the concentration of the first addition (see FIG. 3B).

Figure 3B:
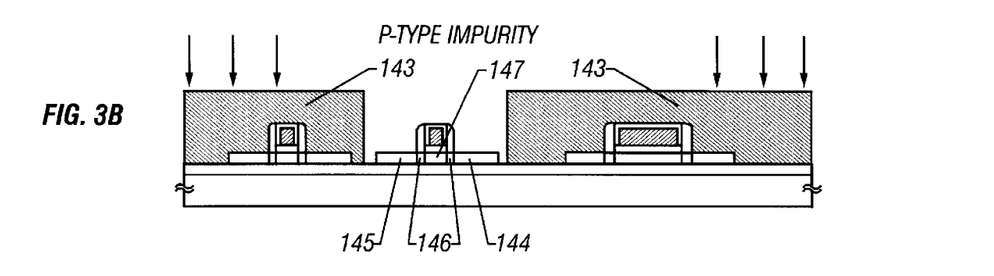

All the active layers are completed in the above manner. After the completion of the steps of adding all the necessary kinds of impurity ions, the resist mask 143 is removed, the impurity ions are activated by a heat treatment of furnace annealing, laser annealing, lamp annealing, or the like. Damage of the active layers caused by the ion implantation is repaired at the same time.

Next, a titanium (Ti) film 148 of 20–50 nm in thickness is formed and a heat treatment of lamp annealing is then performed. At this time, those portions of the silicon films which are in contact with the titanium film 148 are silicified, whereby titanium silicide layers 149–151 are formed in the source and drain regions (see FIG. 3C). Instead of titanium, cobalt (Co), tungsten (W), tantalum (Ta), molybdenum (Mo), or the like may be used.

Figure 3C:
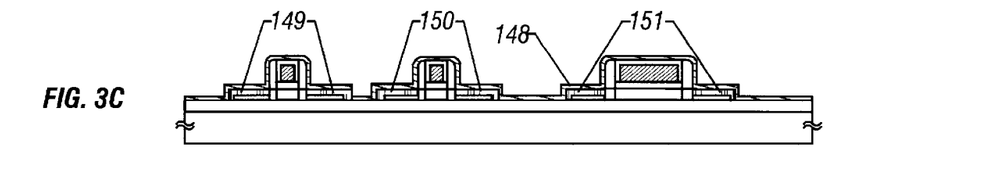

After the completion of the silicification, the titanium film 148 is patterned to form island-like patterns 152–154 on the source and drain regions. The island-like patterns 152–154 will prevent the titanium silicide layers 149–151 from being etched out in later forming contact holes for connecting the source and drain regions and interconnections.

Figure 3D:
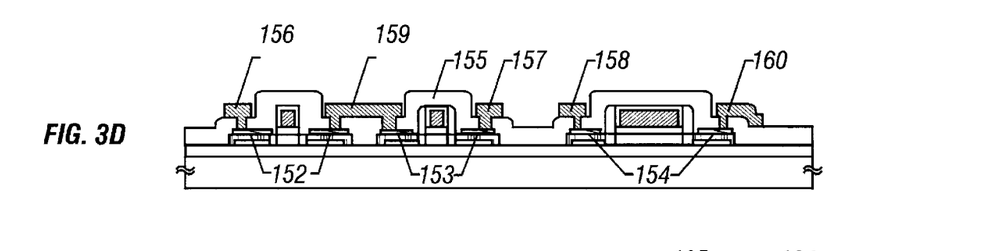

Then, a silicon oxide film of 0.3–1 μm as a first interlayer insulating film 155 is formed. After contact holes are formed through the interlayer insulating film 155, source lines 156–158, drain lines 159 and 160 are formed. The state of FIG. 3D is thus obtained.

In this state, an organic resin film of 0.5–3 μm as a second interlayer insulating film 161 is formed. Polyimide, acrylic, polyamide, polyimideamide, or the like may be used for the organic resin film. The use of the organic resin film is advantageous, for instance, in the following points: (1) It can be formed easily. (2) It can easily be formed at a large thickness. (3) Because of its small relative dielectric constant parasitic capacitances can be made small. (4) It is superior in flatness.

Figure 3E:
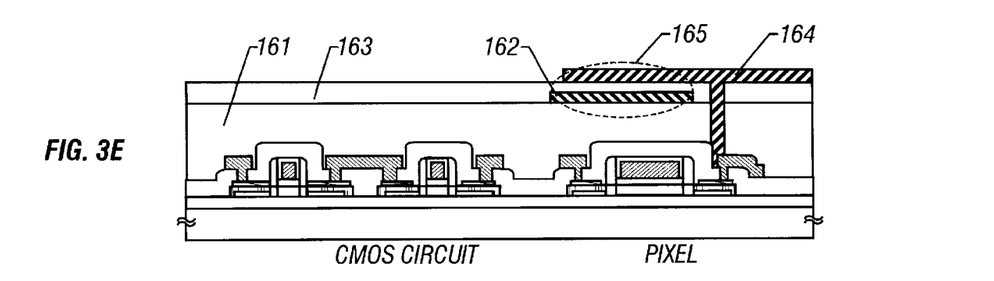

Thereafter, a light interruptive film of 100 nm in thickness as a black mask 162 is formed on the interlayer insulating film 161 (above the pixel TFT). Although in this embodiment a titanium film is used as the black mask 162, a resin film containing a black pigment or the like may be used instead.

After the formation of the black mask 162, an organic resin film is again formed at a thickness of 0.1–0.3 μm as a third interlayer insulating film 163. After contact holes are formed through the second and third interlayer insulating films 161 and 163, a pixel electrode 164 of 120 nm in thickness is formed. An auxiliary capacitor 165 can be formed between the black mask 162 and the pixel electrode 164 (see FIG. 3E).

Finally, the entire devices are hydrogenated by heating the whole substrate in a hydrogen atmosphere, whereby dangling bonds in the films (particularly in the active layers) are compensated for. As a result of the above steps, an active matrix substrate is formed in which the CMOS circuit (left side) and the pixel matrix circuit (right side) are arranged on the same substrate.

A threshold voltage as designed can be secured in a plurality of TFTs formed in the above manner, because boron that is added to the channel forming regions (channel doping) takes effect properly.

Figure 6A:
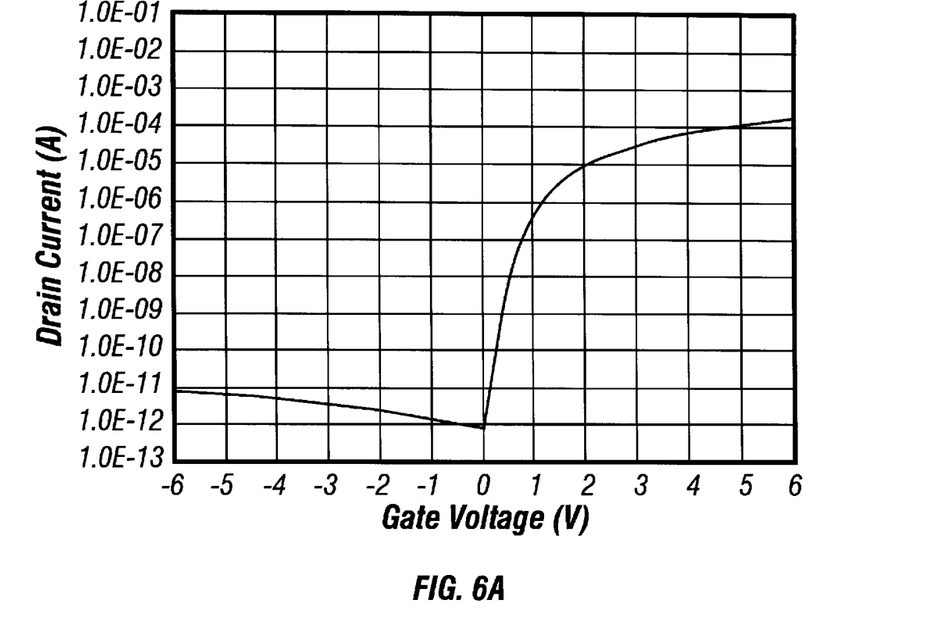
FIGS. 6A–6C show electrical characteristics of TFTs.
Figure 6B:
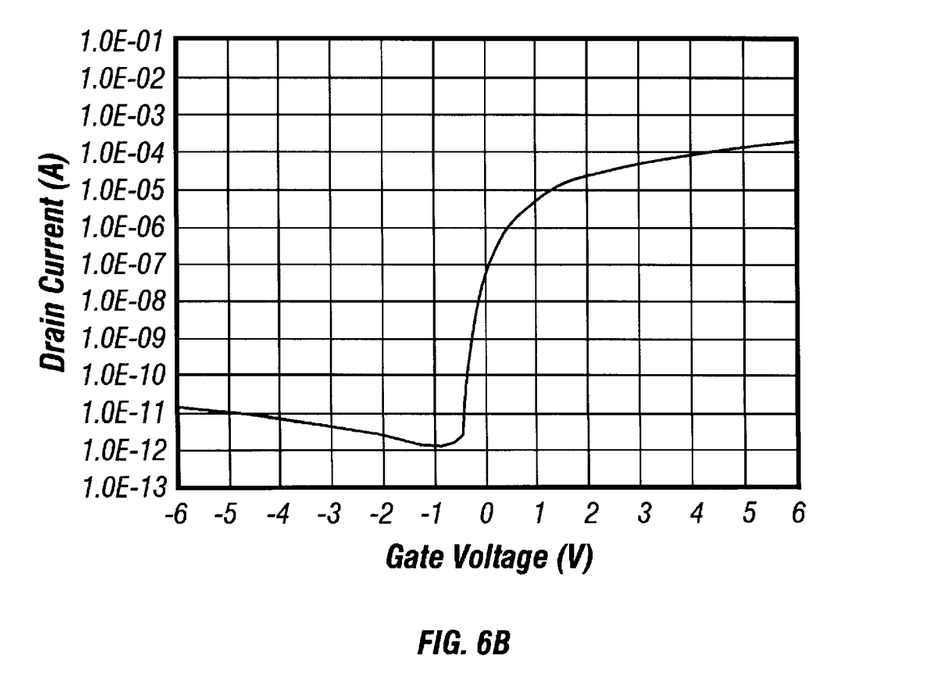
Figure 6C:
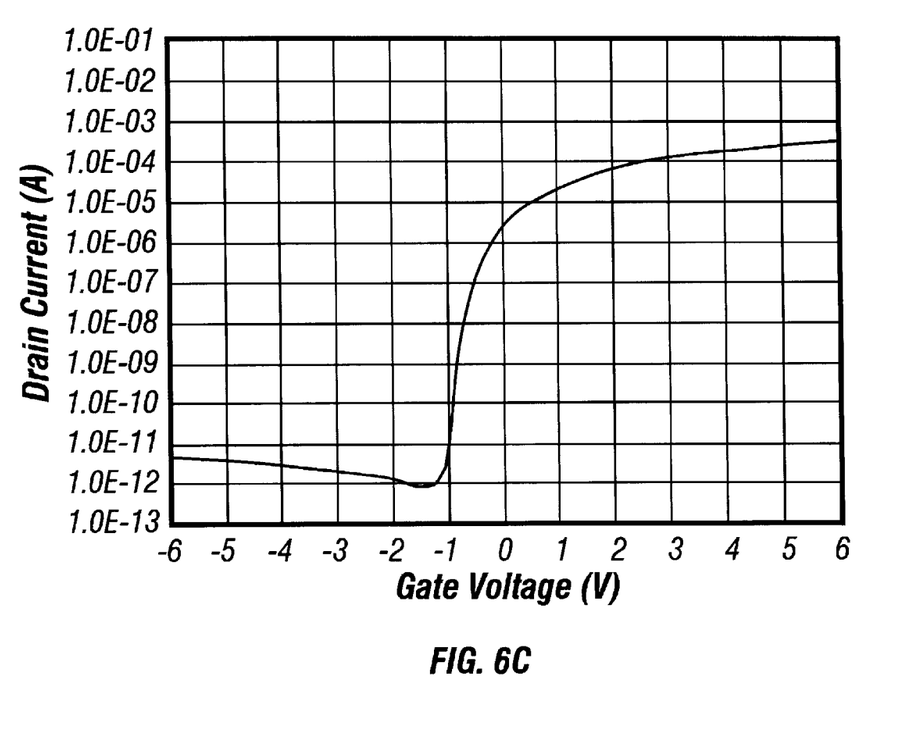

The effect of the present invention will be described below by using electrical characteristics of a TFT shown in FIGS. 6A–6C. The electrical characteristic of a TFT, which is typical data and also called the Id-Vg characteristic, is a graph in which the horizontal axis represents the gate voltage (Vg) and the vertical axis represents the logarithm of the drain current (Id). Since FIGS. 6A–6C are data of n-channel TFTs, in general the TFT is in an off state when the gate voltage is at −6 to 0 V, and it is in an on state when the gate voltage is at 0 V to 6 V. Therefore, in FIG. 6A–6C, the drain current steeply increases in the vicinity of 0 V and switching is thereby made from the off state to the on state (or the drain current steeply decreases and switching is thereby made from the on state to the off state).

More correctly, it is considered that switching between the on state and the off state is made when the gate voltage comes equal to the threshold voltage. That is, the voltage at which the drain current rises in the Id-Vg characteristic is not necessarily equal to the threshold voltage. However, if the Id-Vg characteristic is shifted rightward or leftward in its entirety, the threshold voltage shifts accordingly. Therefore, the shift of the threshold voltage can be evaluated in a relative sense by using the shift of the rise voltage in the Id-Vg characteristic.

FIG. 6A shows an electrical characteristic in a case where the invention is applied (threshold voltage: about 0.3 V), FIG. 6B shows an electrical characteristic in a case where the invention is not applied (threshold voltage: about −0.5 V), and FIG. 6C shows an electrical characteristic obtained by a conventional process in which the channel doping is not performed (threshold voltage: about −0.7 V).

The inventors adjusted the impurity concentration of the channel doping so that the threshold voltage would be shifted to the positive side by 1 V from that of a TFT formed by the conventional process. That is, the shift of the threshold voltage from about −0.7 V (FIG. 6C) to 0.3 V (FIG. 6A) means that the characteristic of FIG. 6A reflects the effect of the channel doping. In the case of FIG. 6B where the invention is not applied, the threshold voltage being −0.5 V indicates that the effect of the channel doping almost disappears. The above experimental results clearly show that the invention is very effective.

As described above, the present invention allows the heat treatment in an atmosphere containing a halogen element to be performed without impairing the effect of the channel doping. That is, a precise threshold voltage control can be performed while the effects of the heat treatment (such as improvement in the crystallinity of a silicon film) is secured.

A TFT formed by the process of this embodiment exhibits much superior performance, for instance, an electrical characteristic equivalent to or even superior to that of an IGFET formed on a single crystal silicon wafer can be obtained. The subthreshold coefficient (S-value) is as small as 60–100 mV/decade in both n-type and p-type TFTs. The field-effect mobility ($\mu_{FE}$) is as large as 200–650 cm$^2$/Vs (typically 250–300 cm$^2$/Vs) in the n-type TFT and 100–300 cm$^2$/Vs (typically 150–200 cm$^2$/Vs) in the P-type TFT.

EMBODIMENT 2

This embodiment is directed to a case where the invention is applied to a high-temperature polysilicon technique. Although for simplicity the following description is directed to a case of forming an n-channel TFT, the present invention can easily be applied to a known single-gate CMOS circuit and dual-gate CMOS circuit.

Figure 4A:
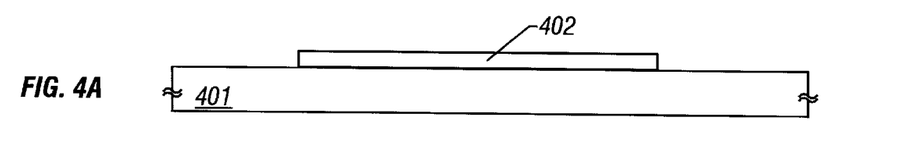
FIGS. 4A–4E show a manufacturing process of a silicon-gate TFT according to a second embodiment of the invention.

In FIG. 4A, reference numerals 401 and 402 denote a quartz substrate and a crystalline silicon film as an active layer, respectively. The crystalline silicon film 402 is obtained by crystallizing an amorphous silicon film by a heat treatment of 600° C. for 24–48 hours. In this embodiment, naturally boron as an impurity element for threshold voltage control is added in forming the amorphous silicon film.

Figure 4B:
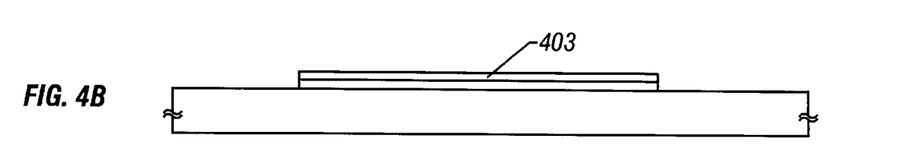

Next, a heat treatment is performed at 1,000° C. for 30 minutes in an oxygen atmosphere containing hydrogen chloride and diborane at 3% and 7%, respectively. As a result, a 50-nm-thick thermal oxidation film 403 to later serve as a gate insulating film (see FIG. 4B).

It is already known that the film quality of a thermal oxidation film (gate insulating film) is improved by having a processing atmosphere contain a halogen element. Also in this embodiment, the impurity element for threshold voltage control is gettered by the halogen element. It is therefore important to render the atmosphere in a chemical equilibrium state by applying the invention.

Figure 4C:
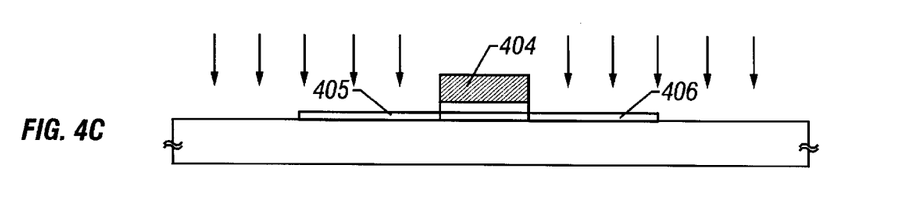

Next, a polysilicon film having n-type conductivity is formed and then patterned into a gate electrode 404. Subsequently, exposed portions of the gate insulating film 403 are removed with a hydrofluoric-acid-type etchant, and then n-type regions 405 and 406 are formed by implanting P ions (see FIG. 4C).

Next, sidewalls 407 are formed by etch back and P ions are again implanted. As a result, a source region 408, a drain region 409, low-concentration impurity regions 410, and a channel forming region 411 are defined. These impurity regions are activated by thermal annealing or laser annealing (see FIG. 4D).

Figure 4D:
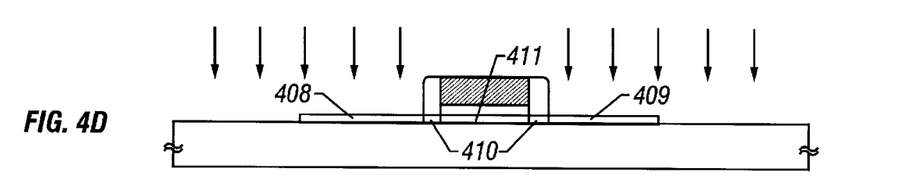

After the state of FIG. 4D is obtained, a cobalt film is formed and then lamp annealing is performed, to form cobalt silicide layers 412–414. This technique is known as the salicide process.

Figure 4E:
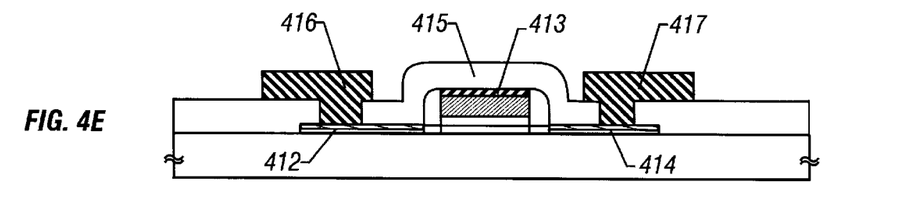

Next, a silicon oxide film as an interlayer insulating film 415 is formed. After contact holes are formed therethrough, a source line 416 and a drain line 417 are formed. Finally, hydrogenation is performed, whereby a silicon-gate TFT is completed as shown in FIG. 4E.

EMBODIMENT 3

While the first and second embodiments are directed to the case of introducing boron by using diborane as one of the gases for forming an amorphous silicon film, B ions may be added by ion implantation or plasma doping without mass separation.

In the latter case, it is desirable that B ions be added before the crystallization step because the implantation of ions into a crystalline silicon film returns it to an amorphous state. By using a mask, B ions may be added selectively, i.e., only to a region that will become a channel forming region.

EMBODIMENT 4

The present invention can be applied to various electro-optical devices. For example, an active matrix liquid crystal display device can be constructed by inserting and holding a liquid crystal between the active matrix substrate of the first embodiment and an opposed substrate. In this case, a transmission-type liquid crystal display device is obtained if the pixel electrodes are formed by using a transparent material, and a reflection-type liquid crystal display device is obtained if they are formed by using a light-reflective material.

Further, an active matrix EL display device, an active matrix EC display device, or the like can easily be manufactured by somewhat changing the configuration of the active matrix substrate.

EMBODIMENT 5

The present invention can be applied to semiconductor devices on the whole whose manufacturing process includes (1) a step of adding an impurity element for threshold voltage control to a channel forming region, and (2) a step of performing a heat treatment in an atmosphere containing a halogen element.

Therefore, the invention can be applied to a semiconductor circuit constituted of IGFETs (insulated-gate field effect transistors) that are formed on a silicon wafer, not to mention a semiconductor circuit formed on a substrate having an insulative surface.

The term "semiconductor device" as used in this specification means any device that functions with the use of a semiconductor and encompasses the following:

(1) an element itself such as a TFT or an IGFET;
(2) a semiconductor circuit using elements of item (1);
(3) an electro-optical device constituted of elements of item (1) and semiconductor circuits of item (2); and
(4) an electronic device having semiconductor circuits of item (2) and an electro-optical device of item (3).

EMBODIMENT 6

In this embodiment, various electronic devices as examples of semiconductor devices to which the present invention can be applied will be described with reference to FIGS. 5A–5E. The invention can be applied to such semiconductor devices as a (digital) video camera, a (digital) still camera, a head-mounted display, a car navigation system, a personal computer, and a portable information terminal (a mobile computer, a cellular telephone, etc.), as well as a PHS(personal handyphone system)-mounted portable information terminal that attracts much attention recently.

Figure 5A:
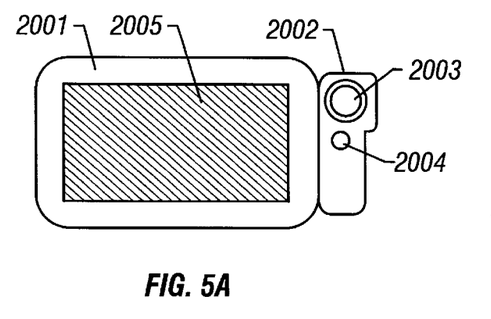
FIGS. 5A–5E show examples of electronic devices according to a sixth embodiment of the invention.

FIG. 5A shows a mobile computer, which consists of a main body 2001, a camera section 2002, an image receiving section 2003, a manipulation switch 2004, and a display device 2005. The invention can be applied to the display device 2005 and internal circuits.

Figure 5B:
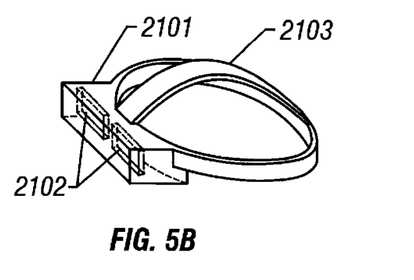

FIG. 5B shows a heat-mounted display, which consists of a main body 2101, display devices 2102, and a band section 2103. The invention can be applied to the display device 2102.

Figure 5C:
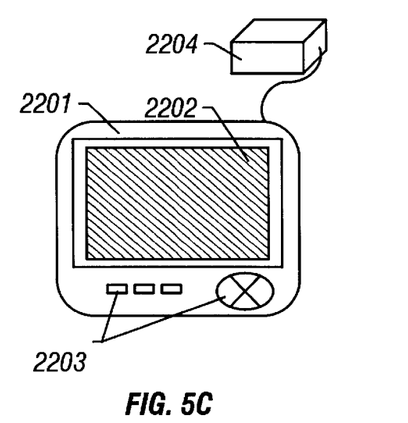

FIG. 5C shows a car navigation system, which consists of a main body 2201, a display device 2202, manipulation switches 2203, and an antenna 2204. The invention can be applied to the display device 2202 and internal circuits.

Figure 5D:
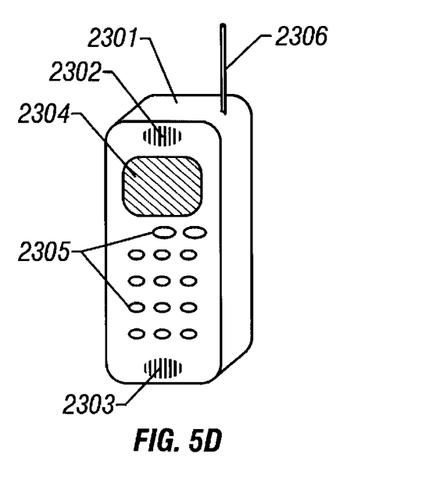

FIG. 5D shows a cellular telephone, which consists of a main body 2301, a voice output section 2302, a voice input section 2303, a display device 2304, manipulation switches 2305, and an antenna 2306. The invention can be applied to the display device 2304, high-frequency circuits for communication, etc.

Figure 5E:
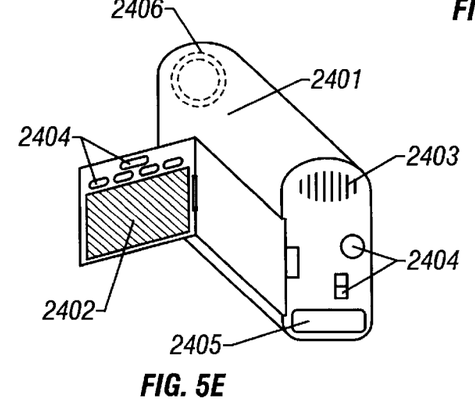

FIG. 5E shows a video camera, which consists of a main body 2401, a display device 2402, a sound input section 2403, manipulation switches 2404, a battery 2405, and an image receiving section 2406. The invention can be applied to the display device 2402.

As described above, the application range of the invention is extremely wide and the invention can be applied to display media of every field. In addition, the invention can be applied to any products for any uses as long as they need a semiconductor circuit such as an IC or an LSI.

As described above, the invention makes it possible to perform a heat treatment in an atmosphere containing a halogen element without impairing the effect of channel doping, thereby enabling a precise threshold voltage control on a semiconductor device that requires such a special process.

What is claimed is:

1. A method of manufacturing a semiconductor device, comprising the steps of:
   forming a semiconductor film comprising amorphous silicon and containing an impurity selected from the group consisting of group-13 and group-15 elements of Periodic Table;
   converting the semiconductor film into a crystalline semiconductor film by performing a heat treatment; and
   performing a heat treatment in an atmosphere containing a halogen element and a compound gas that contains the impurity.

2. A method according to claim 1, wherein said impurity is selected from the group consisting of B, Al, Ga, P, As, and Sb.

3. A method according to claim 1, wherein said atmosphere contains at least one halogen compound gas selected from the group consisting of HCl, HF, $NF_3$, HBr, $Cl_2$, $BCl_3$, $BF_3$, $F_2$, and $Br_2$.

4. A method according to claim 1, wherein said compound gas is selected from the group consisting of $B_2H_6$, $BF_3$, $BCl_3$, $AlCl_3$, $GaCl_3$, $PH_3$, $PF_3$, $PCl_3$, $AsH_3$, $AsF_3$, $AsCl_3$, $SbH_3$, and $SbCl_3$.

5. A method of manufacturing a semiconductor device, comprising the steps of:
   preparing a semiconductor film comprising amorphous silicon containing an impurity selected from the group consisting of group 13 and 15 elements of the Periodic Table;
   providing said semiconductor film with a catalyst element for accelerating crystallization thereof;
   heating said semiconductor film and said catalyst element to crystallize said semiconductor film; and
   reducing a concentration of the catalyst element contained in the crystallized semiconductor film by performing a heat treatment in an atmosphere containing a halogen element and a compound gas that contains the impurity element.

6. A method according to claim 5, wherein the catalyst element is selected from the group consisting of Ni, Fe, Co, Sn, Pd, Pb, Pt, Cu, and Au.

7. A method according to claim 5, wherein said impurity is selected from the group consisting of B, Al, Ga, P, As, and Sb.

8. A method according to claim 5, wherein said atmosphere contains at least one halogen compound gas selected from the group consisting of HCl, HF, $NF_3$, HBr, $Cl_2$, $BCl_3$, $BF_3$, $F_2$, and $Br_2$.

9. A method according to claim 5, wherein said compound gas is selected from the group consisting of $B_2H_6$, $BF_3$, $BCl_3$, $AlCl_3$, $GaCl_3$, $PH_3$, $PF_3$, $PCl_3$, $AsH_3$, $AsF_3$, $AsCl_3$, $SbH_3$, and $SbCl_3$.

10. A method of manufacturing a semiconductor device, comprising the steps of:
    adding an impurity selected from the group consisting of group 13 and 15 elements of the Periodic Table into a semiconductor film comprising amorphous silicon;
    providing said semiconductor film with a catalyst element for accelerating crystallization thereof;
    heating said semiconductor film and said catalyst element to crystallize said semiconductor film; and
    reducing a concentration of the catalyst element contained in the crystallized semiconductor film by performing a heat treatment in an atmosphere containing a halogen element and a compound gas that contains the impurity element.

11. A method according to claim 10, wherein the catalyst element is selected from the group consisting of Ni, Fe, Co, Sn, Pd, Pb, Pt, Cu, and Au.

12. A method according to claim 10, wherein said impurity is selected from the group consisting of B, Al, Ga, P, As, and Sb.

13. A method according to claim 10, wherein said atmosphere contains at least one halogen compound gas selected from the group consisting of HCl, HF, $NF_3$, HBr, $Cl_2$, $BCl_3$, $BF_3$, $F_2$, and $Br_2$.

14. A method according to claim 10, wherein said compound gas is selected from the group consisting of $B_2H_6$, $BF_3$, $BCl_3$, $AlCl_3$, $GaCl_3$, $PH_3$, $PF_3$, $PCl_3$, $AsH_3$, $AsF_3$, $AsCl_3$, $SbH_3$, and $SbCl_3$.

15. A method of manufacturing a semiconductor device including an insulated gate field effect transistor, comprising the steps of:
    preparing a semiconductor layer comprising silicon and doped with a dopant impurity for controlling a threshold voltage of said semiconductor device; and
    heating said semiconductor layer in an atmosphere containing a gettering material for gettering a metal which is contained in said semiconductor layer,
    wherein said atmosphere includes a compound gas comprising said dopant impurity.

16. A method of manufacturing a semiconductor device according to claim 15 wherein said insulated gate field effect transistor is a thin film type.

17. A method according to claim 1, wherein said semiconductor device is an EL display device.

18. A method according to claim 5, wherein said semiconductor device is an EL display device.

19. A method according to claim 10, wherein said semiconductor device is an EL display device.

20. A method according to claim 15, wherein said semiconductor device is an EL display device.

21. A method according to claim 1, wherein said device is one of a mobile computer, head-mount display, car navigation system, cellular telephone and video camera.

22. A method according to claim 5, wherein said device is one of a video camera, head mount display, car navigation system, portable telephone and projector.

23. A method according to claim 10, wherein said device is one of a video camera, head mount display, car navigation system, portable telephone and projector.

24. A method according to claim 15, wherein said device is one of a video camera, head mount display, car navigation system, portable telephone and projector.

* * * * *